United States Patent
Parayanthal

(10) Patent No.: US 6,542,533 B1
(45) Date of Patent: Apr. 1, 2003

(54) PROCESS FOR OBTAINING ULTRA-LOW REFLECTIVITY FACETS FOR ELECTRO-ABSORPTION MODULATED LASERS

(75) Inventor: Padman Parayanthal, Breinigsville, PA (US)

(73) Assignee: TriQuint Technology Holding Co, Hillsboro, OR (US)

( * ) Notice: Subject to any disclaimer, the term of this patent is extended or adjusted under 35 U.S.C. 154(b) by 0 days.

(21) Appl. No.: 09/545,765

(22) Filed: Apr. 10, 2000

(51) Int. Cl.[7] .............................. H01S 3/10; H01S 5/00; H01S 3/03; H01S 3/08
(52) U.S. Cl. .............................. 372/64; 372/26; 372/45; 372/50; 372/62; 372/96
(58) Field of Search ...................................... 372/92, 75

(56) References Cited

U.S. PATENT DOCUMENTS 6,118,802 A * 9/2000 Sanders et al. ............... 372/50

* cited by examiner

*Primary Examiner*—Paul Ip
*Assistant Examiner*—Armando Rodriguez

(57) ABSTRACT

An electro-absorption modulated laser is provided having three sections, a laser section, an isolation section, and a modulation section. The laser section produces light along a straight waveguide path. The modulation section also has a straight waveguide path, but is angled with respect to the laser section's path. The isolation section between the other two sections includes a path that is collinear with the respective laser or modulation section at each end, but is gradually curved in the middle.

6 Claims, 2 Drawing Sheets

PROCESS FOR OBTAINING ULTRA-LOW REFLECTIVITY FACETS FOR ELECTRO-ABSORPTION MODULATED LASERS

FIELD OF THE INVENTION

This invention relates generally to optoelectronics and fiber optic communication systems and, more specifically, to a method of reducing the reflectivity in facets of optoelectronics employing waveguides, such as electro-absorption modulated semiconductor lasers (EMLs).

BACKGROUND OF THE INVENTION

Semiconductor lasers, and more specifically EMLs, have become increasingly important in communication systems as they are well suited for generation and transmission of signals in fiber optic communications. Current communication systems, termed Dense Wavelength Division Multiplexed (DWDM) systems, involve channel spacing that is becoming smaller and smaller as the demand for bandwidth increases. The transmission distance between nodes and amplifiers without regeneration is also being pushed higher. These specifications have increased the need for low noise and high efficiency from the system components, such as the semiconductor lasers.

These EMLs generally include a distributed feedback (DFB) laser section 12 and an electrically isolated modulator section 20, combined as a monolithically integrated device (Ketelsen et al., IEEE Int Semiconductor Conf Sep. 1998, pp. 219; Johnson et al., IEEE Int Semiconductor Conf Sep. 1994, paper M4.7; Suzuki et al., J Lightwave Technol 1987; LT-5: 1277) (See FIG. 1). The laser portion converts electrical energy into light. The modulator portion modulates the light produced by the laser portion corresponding to an electrical signal received from a signal generator. A typical configuration, as shown in FIG. 1A, is formed on an InP substrate 12 with the grating layer 16 etched on the substrate, providing frequency-selective feedback for lasing wavelength selectivity. The fabrication of the device involves growing the layers of the DFB laser 10, isolation section 30, and the modulator section 20, using known selective area growth (SAG) processes. Narrow mesas are then etched on the wafer to form the waveguide 14, using a solution of $Br_2$ in $CH_3OH$ with a dielectric (e.g., $SiO_2$) mask defining the mesa pattern. A blocking structure 15 of Fe-doped InP is grown to confine the current to the active region and reduce the capacitance of the modulator. Further, a p-InP and p-InGaAs cap 17 is grown, and electrodes 18, 19 are formed on the p-side of the EML to provide electrical connection. The modulator section 20 in such known devices is collinear with the laser section 10, i.e. there is no angle between the centerlines of the waveguides of the laser and modulator sections.

The residual reflectivity of the modulator optical facet results in increased wavelength chirp and poor noise characteristics. When the absorption in the modulator changes due to the applied electrical signal, the feedback from the modulator facet 21 changes, and hence the laser threshold condition becomes modified. This results in wavelength variation and increased noise from the laser section 10. In turn, these poor characteristics degrade the transmission quality and limit the transmission performance in DWDM systems.

One prior solution to the reflectivity problem is to use anti-reflection coatings on the facets combined with a window structure to reduce the residual reflectivity to as low as −50 dB. This is shown in FIG. 1B, where the laser section is typically 300 $\mu$m in length, the isolation section is about 140 $\mu$m and the modulator is about 235 $\mu$m. There is also an InP window 21 on the end of the modulator section which has an anti-reflection (HR) coating, e.g., less than 0.1%, in order to reduce the residual reflectivity. The laser section facet 11 has a high reflection (HR) coating, e.g. 85%. The overall EML chip length is 750 $\mu$m.

However, significant variations in residual reflectivity occur due to the variation of the window length, the natural variation of the refractive index and the thickness of the material used for the anti-reflective coating. Any further improvements in anti-reflective coatings will likely require major process development for the coating process and for the cleaving process.

Another prior solution is the use of angled facets (Rideout et al., Electronic Letters 1990; 26: 36–37; Zah et al., Electronic Letters 1987; 23: 990–991). Angled facets, even without the use of any anti-reflective coating, have demonstrated reflectivity less than −40 dB. Angled facets involve tilting the waveguide relative to the cleaved facet, and have been used to obtain very low reflectivity facets. These are employed in fabricating semiconductor optical amplifiers where both facets require low reflectivity. These facets can also be applied to lasers that require anti-reflective coatings on both facets (i.e., quarter wave shifted DFB's). However, many EMLs use a conventional DFB design for the laser portion and therefore require high reflectivity at the back facet and anti-reflective coating on the modulator facet. Thus, a simple angled facet is not appropriate for conventional DFB design, or for EMLs.

Angled facets have also been used in combination with anti-reflectivity coatings in amplifiers to achieve residual modal reflectivity to a value of $10^{-4}$. However, since this design is anti-reflective at both facets, it is still inappropriate for use in EMLs using the conventional DFB design for the laser section.

SUMMARY OF THE INVENTION

The present invention is directed to overcoming the deficiencies of the prior art by creating an EML with ultra-low reflectivity facets that are relatively simple to manufacture, are resistant to degradation and do not require anti-reflective coatings on the facets.

In an illustrative embodiment of the invention, an EML is provided with three sections, a laser section, an isolation section, and a modulation section. The laser section produces light along a straight waveguide path. The modulation section also has a straight waveguide path, but is angled with respect to the laser section's path. The isolation section between the other two sections includes a path that is collinear with the respective laser or modulation section at each end, but is gradually curved in the middle.

BRIEF DESCRIPTION OF THE DRAWINGS

The aforementioned and other objects and advantages will become apparent to those skilled in the art upon reading the following detailed description of the preferred embodiments, in conjunction with a review of the appended drawings wherein.

DETAILED DESCRIPTION OF THE PREFERRED EMBODIMENTS

Figure 1A:
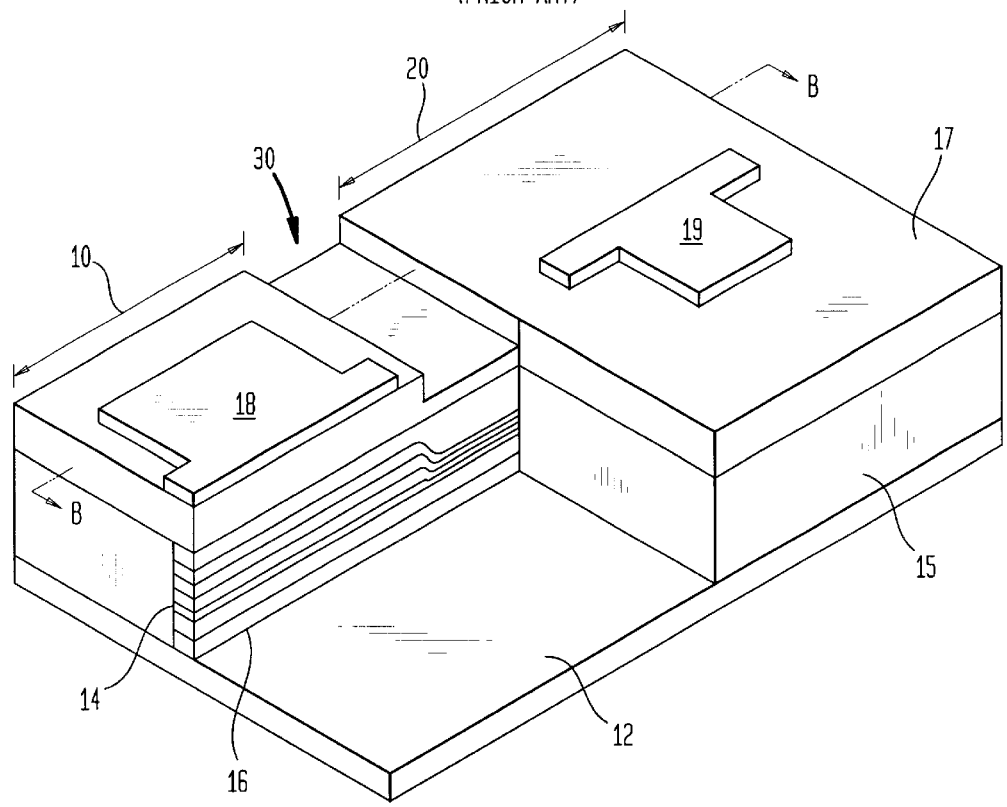
FIG. 1A is a schematic top perspective diagram of a conventional monolithically integrated EML, including a laser section and an electrically isolated modulator section, wherein the modulator facet has an anti-reflection (AR) coating and the laser facet a high-reflection (HR) coating.
Figure 1B:
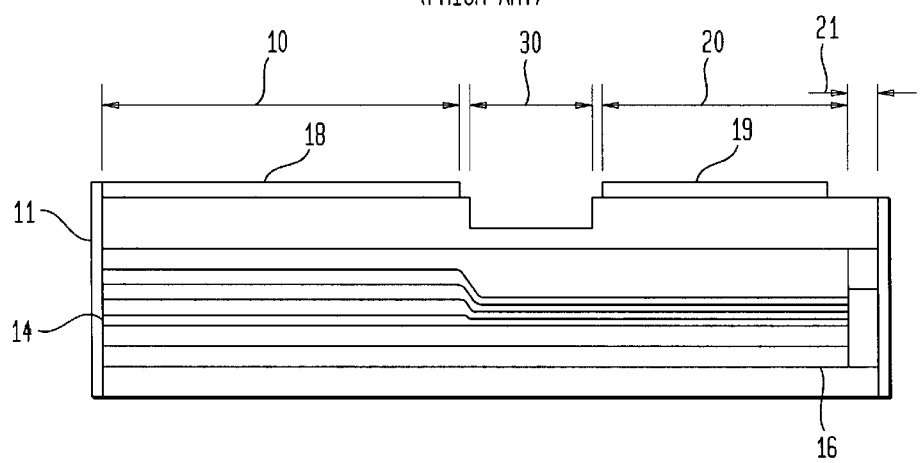
FIG. 1B is a cross-sectional view along line B—B of FIG. 1A.
Figure 2:
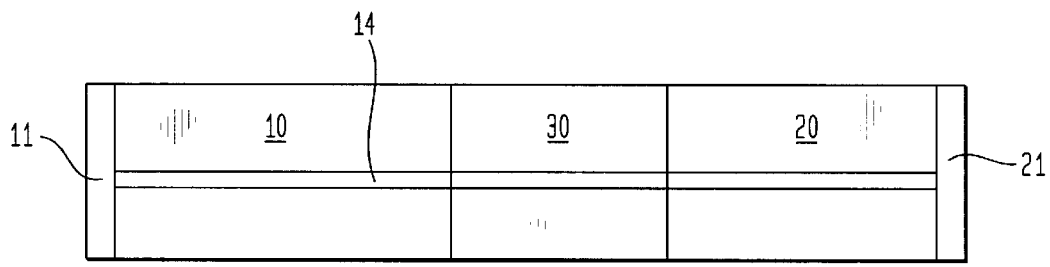
FIG. 2 is a schematic diagram of a conventional monolithically integrated EML, in which the conventional modulator section is collinear with the laser section, i.e. there is no angle between the centerlines of the waveguides of the laser and modulator sections.

Referring now to FIG. 2 of the drawings, here is shown schematically a conventional EMNL device with a semiconductor laser section 10, an isolation section 30 and a modulator section 20 which are aligned. The laser section 10, as is known, converts electrical energy into light that travels within a waveguide 14 formed within the laser section. At the back end of the laser section is a high-reflectivity (HR) coating 11 that causes light to be reflected within the waveguide 14 and ultimately out of the front end of the laser section, through the isolation section and the modulator section, including window 21. The waveguide 14 is preferably linear from the surface 11 through window 21.

Figure 3:
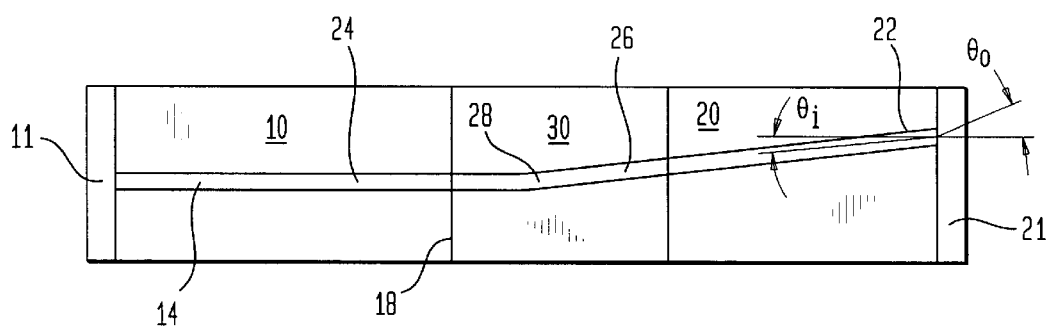
FIG. 3 is a schematic diagram of a monolithically integrated EML according to a preferred embodiment of the present invention.

According to the present invention, as shown in FIG. 3 the waveguide 14 has separate sections; section 24 in the laser, section 26 in the isolation section, and section 22 in the modulator section. Also, in the present invention, the waveguide 22 of the modulator, while linear within the modulator section, is not collinear with the laser section waveguide 24. There is preferably an angle ($\theta_i$) between the centerlines of the laser waveguide 24 and the modulator section waveguides 22. While this angle may be any angle in the range from about 0 to about 90 degrees, it is preferred that the angle remain in the range of approximately 4 to 10 degrees.

The isolation section 30 according to the preferred embodiment of the present invention, has waveguide 26 that, unlike those in the laser and modulated sections, is not straight within the section. The waveguide 26 mates directly with the waveguide 24 in the front end of the laser section and waveguide 22 at the back end of the modulator section. The waveguide is collinear with each of the adjacent waveguides, but includes a bend portion 28 in its midsection to accommodate the angle between the waveguides in the laser and modulated sections. The bend portion 28 is preferably a smooth, gradual bend, having the largest possible radius of curvature within the limitations imposed by the size of the isolation section 30 and its proximity to the other sections. It is preferred that at least a portion of each end of the isolation section waveguide 26 not be curved. The minimum allowable radius of curvature is determined by two factors: (1) the condition that the preferred angle between the laser section waveguide and modulator section remain in the range of 4–10 degrees; and (2) the available length of the isolation region. It is preferred that the largest radius of curvature be maintained for the isolation region waveguide which connects the laser section to the modulator section.

The front of window 21 of the modulator section 20 is, optionally, coated with an anti-reflective (AR) coating, as it is desirable that the light exit the EML at this interface.

The isolation section 30 between the laser and modulator sections is small, and if the curve is sharp, bend losses will increase the insertion loss. Refractive index variations at the laser-isolation and laser-modulator interfaces can lead to residual reflections from those interfaces, thus having a negative impact on the EML performance. To eliminate negative effects from these interfaces, the refractive indices of the isolation and modulator sections 30, 20 are preferably matched so that the light path remains along the centerline of the waveguides 26, 22. Preferably, the refractive indices of the laser and isolation sections 10, 30 are also matched to prevent any negative effects at their interface, although this interface is less sensitive since it is perpendicular to the light path and waveguides.

The waveguides for the three sections are preferably formed during a mesa formation step. The mesa oxide layer generally used to create waveguides is co-linear as is presently practiced. To accomplish the inventive curved shape of the isolation section and the angle of the modulator section, the stripe pattern in the mask used to form the mesa oxide layer can be formed with the corresponding shape. Since the wet etch process is non-selective, the waveguide shape after etching will follow the oxide mask pattern. Of course, other semiconductor fabrication techniques are known and any suitable technique may be used to form the waveguides in the monolithic device. It is also not necessary to the functioning of the invention that the overall device be monolithic, although the manufacturing benefits of a monolithic device are substantial.

With the isolation and modulator sections of the present invention, the residual reflectivity can be significantly reduced (to less than about –40 dB), without the use of anti-reflective coatings, thus improving wavelength and noise characteristics.

In one embodiment, however, the modulator facets of the present device are coated with an anti-reflective coating to further reduce the residual reflectivity of the modulator facet and, hence, to improve the noise and wavelength characteristics. Although current manufacturing techniques make this option currently undesirable from either a consistency or cost perspective, it is believed that such a combination of the unique isolation and modulator sections with anti-reflective facet coatings is within the scope of the invention.

It is also contemplated as part of the invention that, in addition to the angled facet, an anti-reflective coating, and/or a window structure, both generally known in the art, may be used in combination to reduce the residual reflectivity by several orders of magnitude.

Thus, the present invention provides an electro-absorption modulated laser having the desired ultra-low reflectivity facets and noise reduction capabilities without the use of anti-reflective facet coatings. It will be understood by those skilled in the art that many minor variations may be made to the elements of the present embodiments without departing from the spirit and scope of the invention. It is to be understood that the above embodiments have been shown and described for the purpose of illustration and not for the purpose of limitation, the invention only being limited by the claims, as follow:

What is claimed is:

1. A semiconductor laser, comprising:
   a laser section having a first optical waveguide;
   a modulation section having a second optical waveguide;
   an isolation section between said laser section and said modulation section having a third optical waveguide, said third optical waveguide being in optical communication with said first and second waveguides, said third optical waveguide having a bend portion in which said second waveguide is positioned at an angle with respect to said first waveguide.

2. A semiconductor laser as in claim 1, in which said first and second waveguides are linear.

3. A semiconductor laser as in claim 1, in which said angle is within the range of 4 to 10 degrees.

4. A semiconductor laser as in claim 1, in which said second waveguide has two ends, one of which is in optical communication with said third waveguide and the other of which is coated with an anti-reflective coating.

5. A semiconductor laser as in claim 1, in which said first waveguide has two ends, one of which is in optical communication with said third waveguide and the other of which is coated with a high-reflectivity coating.

6. A semiconductor laser as in claim 1 wherein the laser section comprises a distributed feedback laser.

* * * * *